United States Patent [19]
Hawthorne et al.

[11] Patent Number: 5,785,875
[45] Date of Patent: Jul. 28, 1998

[54] PHOTORESIST REMOVAL PROCESS USING HEATED SOLVENT VAPOR

[75] Inventors: Richard C. Hawthorne; Jonathan C. Morgan, both of Nampa; Li Li, Meridian, all of Id.

[73] Assignee: Micron Technology, Inc., Boise, Id.

[21] Appl. No.: 600,814

[22] Filed: Feb. 13, 1996

[51] Int. Cl.$^6$ ............................................. H01L 21/02
[52] U.S. Cl. ............................ 216/41; 216/83; 216/99; 216/108
[58] Field of Search .................... 216/41, 49, 51, 216/67, 83, 96, 99, 108, 109; 156/638.1, 643.1, 646.1, 659.11

[56] References Cited

U.S. PATENT DOCUMENTS

| | | | |
|---|---|---|---|
| 4,780,176 | 10/1988 | Sudarshan et al. | 216/67 |
| 4,917,123 | 4/1990 | McConnell et al. | 134/95 |
| 4,975,147 | 12/1990 | Tahara et al. | 216/75 |
| 5,262,001 | 11/1993 | Takehara | 216/67 |
| 5,380,397 | 1/1995 | Fukuyama et al. | 216/67 |
| 5,468,686 | 11/1995 | Kawmoto | 156/643.1 |
| 5,626,775 | 5/1997 | Roberts et al. | 216/67 |

FOREIGN PATENT DOCUMENTS 62-43132  8/1985  Japan.

*Primary Examiner*—T. Tung
*Attorney, Agent, or Firm*—Workman, Nydegger & Seeley

[57] ABSTRACT

Disclosed is a method for the removal of a layer of photoresist material from a surface of a film located on an in-process integrated circuit wafer subsequent to etching the film through the photoresist material layer. The method disclosed herein comprises first, applying a layer of the photoresist material layer over the film, then patterning the photoresist material, etching the film, and finally, removing the photoresist material. The etch is preferably a wet etch conducted in a closed reaction chamber. The photoresist material removal can be conducted within the same closed reaction chamber as that in which the etch was conducted. Photoresist material removal is achieved by exposing the photoresist material to heated solvent vapors. One particularly advantageous vapor solvent comprises isopropyl alcohol. Subsequent to the photoresist material removal, the film is preferably subjected to cleaning, rinsing, and drying methods, all of which can be conducted within the same closed reaction chamber.

35 Claims, 3 Drawing Sheets

PHOTORESIST REMOVAL PROCESS USING HEATED SOLVENT VAPOR

BACKGROUND OF THE INVENTION

1. The Field of the Invention

The present invention relates to a method for removing photoresist material. More particularly, the present invention comprises a method of photoresist material removal using heated solvent vapor.

2. The Relevant Technology

In the manufacture of integrated circuits, it is sometimes necessary to etch openings or other geometries into a thin film deposited or grown on the surface of silicon, gallium arsenite, glass, or other substrates located on an in-process integrated circuit wafer. Present methodology for etching such a film requires that the film be exposed to a chemical etching agent to remove portions of the film. The composition of the etching agent used to remove the portions of the film depends upon the nature of film. In the case of oxides, for example, the etching agent may be hydrofluoric acid. In the case of polysilicon, it will typically be hydrofluoric acid, mixtures comprised of nitric acid, acetic acid, etc.

In order to assure that only desired portions of the film are removed, a photolithography process is used, through which a pattern in a computer drafted photo mask is transferred to the surface of the film, and serves to identify the areas of the film which are to be selectively removed. This pattern is formed with a photoresist material, which is a light sensitive material spun onto the in-process integrated circuit wafer in a thin film and exposed to high intensity light projected through the photo mask. The exposed or unexposed photoresist material, depending on the polarity of the photoresist material, is dissolved with developers, leaving a pattern which allows etching to take place in the selected areas, while preventing etching in other areas.

After the etch, which occurs in a chemically resistant vessel, the in-process integrated circuit wafers are transferred to another vessel to be rinsed. The substrates are then transferred to yet another machine to be dried. The substrates must then be subjected to additional processing, wet or dry, to remove the photoresist material, after which the in-process integrated circuit wafers are rinsed and then dried. The rinsing and drying are also conducted in separate chambers or machines.

Current methods for removing or "stripping" the photoresist material include a hot chemical removal with a chemical etching agent such as sulfuric acid and hydrogen peroxide, or a dry reactive removal generally known as photoresist ashing. The hot chemical removal method is undesirable in that it typically involves great expense due to the large amount of the chemical etching agent needed, and requires expensive disposal methods due to the caustic nature of the chemical etching agent. The ashing method is undesirable in that it involves a high energy gas and often incurs damage to the silicon substrate.

A further disadvantage of prior art photoresist material removal methods is that they require a plurality of different procedures, each of which must be conducted in a separate vessel or chamber. For instance, a typical prior art method comprises the following steps. First, the silicon substrate is prepared in one location with a film, such as a doped silicon surface film, which is to be etched and upon which the photoresist material is spun on. The photoresist material is then patterned at another location and the undeveloped photoresist material is removed, after which the in-process integrated circuit wafers are moved to a separate chamber where they are subjected to the etching process, for instance a wet acid bath etching process.

Once etched, the in-process integrated circuit wafers are taken out of the bath, they are rinsed and dried, and are taken to a separate tool where the photoresist material is removed. If subsequent cleaning procedures are required, more chambers are necessary. Transferring the in-process integrated circuit wafers between chambers results in exposure to an ambient atmosphere, which is undesirable in that native oxide films can grow on the film surface as a result of contact with oxygen in the ambient atmosphere. The multiple chambers are expensive, and the procedure of transferring the in-process integrated circuit wafers between the chambers is time consuming and reduces throughput.

Thus, a method is needed with which wafers can be cleaned without incurring the expense involved with the caustic chemicals that are necessary in the prior art. Furthermore, such a method with fewer methods steps is needed, which can be conducted preferably in a single chamber, or even more preferably, in the chamber in which the etch was conducted, and which can be followed with subsequent cleaning steps, also preferably in the same chamber.

SUMMARY AND OBJECTS OF THE INVENTION

The present invention seeks to resolve the above and other problems that have been experienced in the art. More particularly, the present invention constitutes an advancement in the art by providing a method for removing photoresist material from a silicon substrate which achieves each of the objects listed below.

It is an object of the present invention to provide a method for removing photoresist material from a film surface on an in-process integrated circuit wafer without the need for large amounts of caustic chemicals, thereby rendering the method inexpensive, safe, and environmentally friendly.

It is also an object of the present invention to provide such a method which eliminates the need for a separate chamber or vessel for each method step, and which in turn reduces the amount of equipment needed for the method.

It is also an object of the present invention to provide such a method wherein various of the method steps are conducted with no exposure to an ambient atmosphere occurring between the method steps.

It is further an object of the present invention to provide such a method which can be followed with a subsequent cleaning procedure, also within the same chamber.

It is yet another object of the present invention to provide such a method which can be effectively conducted on any nonorganic substrate or film.

To achieve the foregoing objects, and in accordance with the invention as embodied and broadly described herein, a method is provided for photoresist material removal from a film on an in-process integrated circuit wafer using heated solvent vapor. It has been discovered by the inventors that while liquid and vapor solvent at normal temperatures will not solubilize photoresist material, heated solvent vapor will solubilize and strip away photoresist material from an underlying film. Thus, the present invention comprises a method utilizing the following steps. First, the silicon substrate is formed on the in-process integrated circuit wafer, and the film is provided thereon. A layer of the photoresist material is spun onto a surface of the film and patterned, after which the film is etched with the use of the photoresist material. Under the present invention, this is preferably conducted in a sealed reaction chamber and comprises a wet acid etch.

The wet acid etch is conducted in a controlled environment within the closed reaction chamber, after which the photoresist material is removed, also preferably in the controlled environment of the same closed reaction chamber. This procedure preferably comprises draining the etching agent, which is typically a hydrous acid, from the closed chamber while inserting heated solvent vapor into the chamber. The heated solvent vapor can be acetone, alcohols, or another solvent, but preferably comprises isopropyl alcohol, and is heated to the range of between about 50° C. and about 100° C. A clean with the heated solvent vapor is conducted for a sufficient period of time to completely solubilize the photoresist material. Circulation of the heated solvent vapor causes the photoresist material to be carried away to a drain below the chamber by gravity feed, or by application of a vacuum-like pressure. Afterwards, further cleaning procedures can be conducted on the film if it is necessary that the film be in a highly clean state. The further cleaning procedures can also be conducted within the same closed reaction chamber. Thereafter, the in-process integrated circuit wafer is rinsed and dried, preferably within the same closed reaction chamber. Further steps, such as gate oxide formation can then be conducted. The photoresist material is thoroughly removed from the film, leaving a clean surface to which further layers will completely adhere. Thus, a solid bond will be formed with the further layers, resulting in high structural integrity, device performance, and reliability. The solvent is typically not caustic, and disposal procedures are much less expensive than for caustic chemical cleaning agents.

Thus, a method is provided which eliminates the need for large amounts of caustic chemical cleaning agents to remove photoresist material, thereby reducing the cost of supplying expensive chemical cleaning agents, and also reducing the cost of disposing of the chemical cleaning agents. Furthermore, the cleaning can be conducted in a single chamber with a wet acid etch, thereby reducing the cost of supplying further processing chambers as well as increasing throughput and reducing incidences of exposure of the in-process integrated circuit wafer to an ambient atmosphere.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is based upon the discovery by the inventor that, while a liquid or vaporous solvent such as isopropyl alcohol does not substantially strip photoresist material from an in-process integrated circuit wafer surface, once the solvent is heated and vaporized, particularly in the case of isopropyl alcohol, it does effectively and efficiently solubilize and strip the photoresist material from the silicon substrate surface. In accordance with this discovery, the present invention comprises a method of removing photoresist material with heated solvent vapor. The present invention also comprises a method whereby a wet acid etch step and a subsequent photoresist material removal step can both be conducted in the same closed reaction chamber.

In the first step of the method of the present invention, the in-process integrated circuit wafer is provided and is prepared with a film which is to be etche: This typically comprises forming an in-process integrated circuit wafer of crystallized silicon and thereafter forming a film on the silicon substrate which must be patterned in a particular manner. The film typically comprises doped silicon, polysilicon, nitride, or other layers necessary to an in-process integrated circuit. In order to etch a pattern, which typically comprises contact openings and other semiconductor device geometries, the film is first covered with a layer of photoresist material. A mask is then constructed, and the photoresist material is developed through the mask using photolithography. Next, the in-process integrated circuit wafer is etched. Any type of etch can be conducted under the process of the present invention, but it is preferred that a wet acid etch be conducted. Consequently, the wet acid etch and subsequent photoresist material removal can be conducted within a single closed reaction chamber such as that of FIG. 1.

Figure 1:
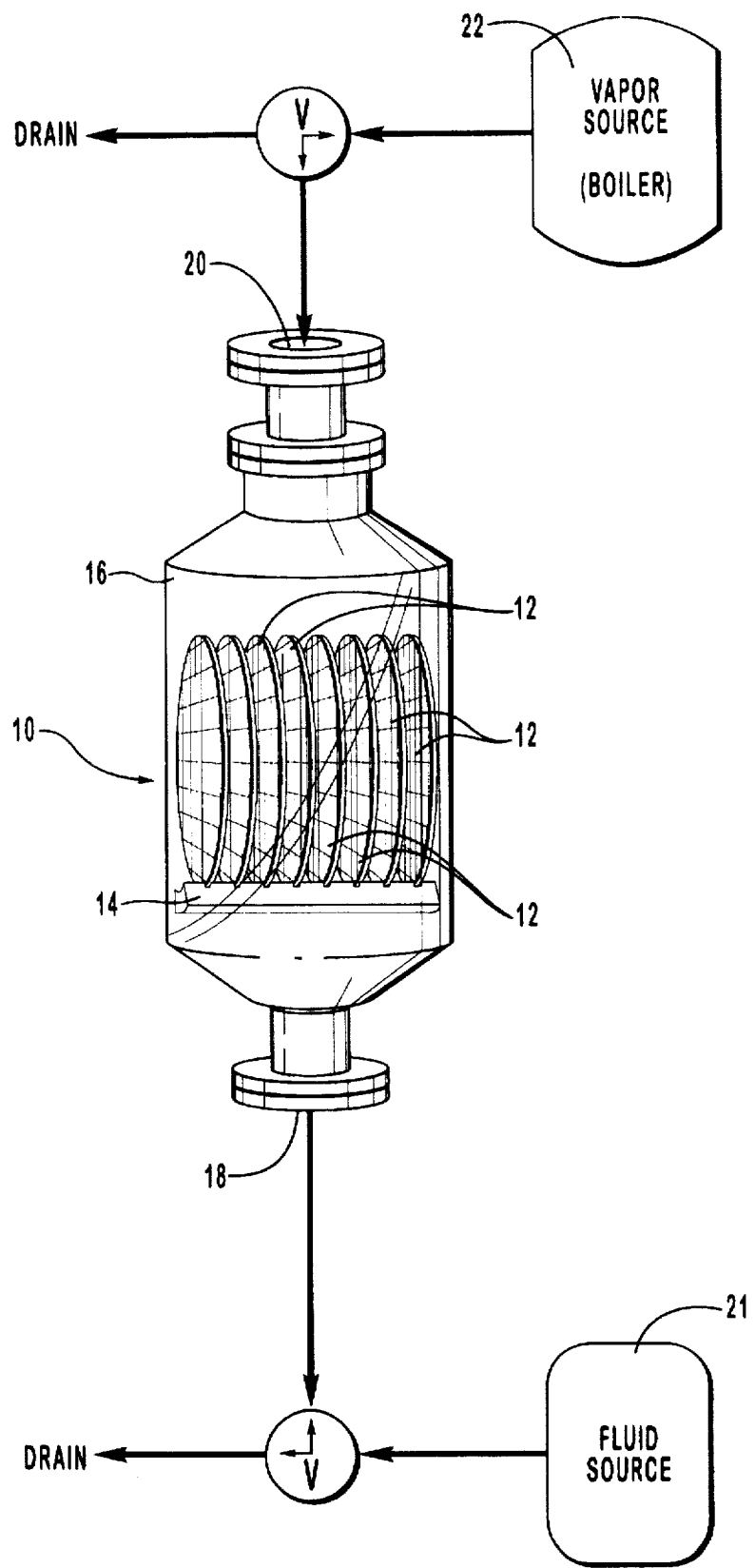
FIG. 1 is a cross-sectional view of a closed reaction chamber having located therein silicon wafers which are undergoing a wet acid etch in a closed environment in one step of the method of the present invention.
Figure 3:
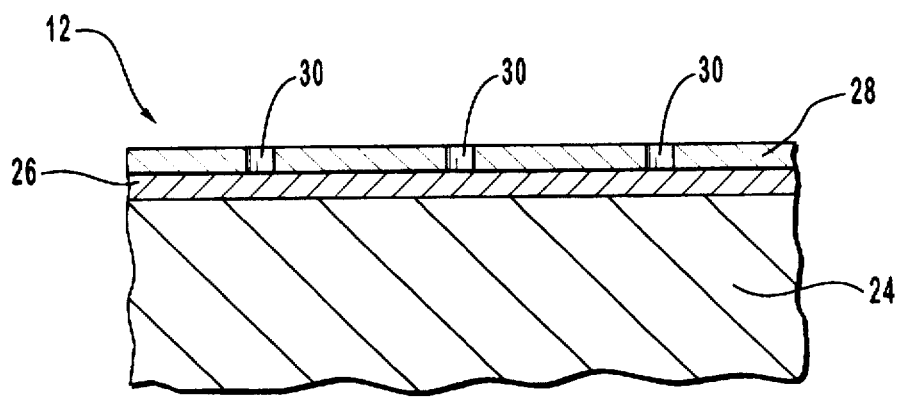
FIG. 3 is a cut-out view showing a silicon wafer located in the closed reaction chamber of FIG. 2, with the silicon wafer depicted in a cross-sectional view taken along the 3—3 section-line seen in FIG. 2.

Shown in FIG. 1 is a reaction chamber 10 having located therein a batch of in-process integrated circuit wafers 12 located in a boat 14. Chamber 10 is preferably closed, and forms a controlled environment, such that its contents are not exposed to the ambient atmosphere. FIG. 3 shows a typical wafer 12 formed as a silicon substrate 24 having deposited thereon a film 26. A layer of photoresist material 28 is spun-on above film 26. Photoresist material 28 is exposed and then developed to be patterned as seen in FIG. 3, where openings 30 in photoresist material 28 allow film 26 to be etched in a subsequent etching process step.

While in reaction chamber 10, wafers 12 are never exposed to the ambient atmosphere. Thus, contaminates such as oxygen cannot come into contact with the surface of wafers 12. Without exposure to oxygen, native oxide layers will not form thereon. Reaction chamber 10 is preferably similar to the chamber disclosed in U.S. Pat. No. 4,917,123 to Christopher F. McConnel, which is incorporated herein by reference. Alternatively, reaction chamber 10 could comprise a module or separate modules within a tool cluster.

Under the present inventive method, an interior 16 of reaction chamber 10 is first filled with a hydrous material, such as water, from a fluid source 21 through valve and into a bottom chamber opening 18 of chamber 10. In this manner, wafers 12 are fully submerged and isolated from the ambient atmosphere. Gradually, an etching agent is injected, such as through a fluid source 21, into the hydrous material within chamber 10 until the etching agent and hydrous material come to a desired relative concentration. The etching agent and hydrous material are exposed to wafers 12 for a predetermined amount of time to suitably etch through openings 30 into film 26.

Figure 2:
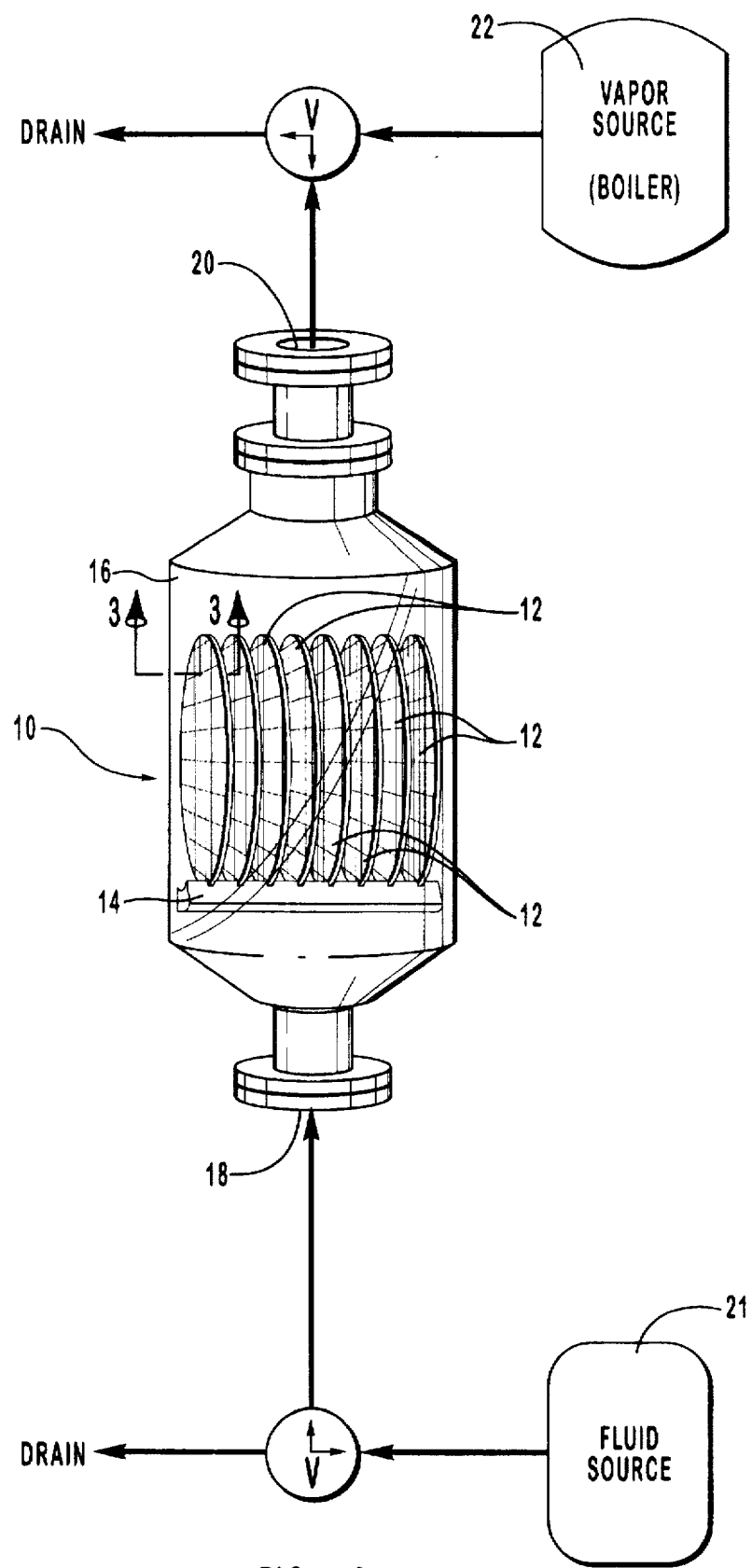
FIG. 2 is a cross-sectional view of the closed reaction chamber of FIG. 1 undergoing a step of photoresist material removal with a heated solvent vapor in a further step of the method of the present invention.

Once the etch is conducted, photoresist material 28 must be stripped from film 26. Prior art methods typically requires that wafers 12 be removed from reaction chamber 10 and placed in a separate chamber, thus potentially exposing wafers 12 to the ambient atmosphere. The inventive method, however, permits wafers 12 to be stripped of photoresist material 28 in situ within reaction chamber 10. Thus, the next step in the method of the present invention is shown in FIG. 2 and comprises exposing wafers 12 to heated solvent vapor within reaction chamber 10. Preferably, this next step comprises flowing the heated solvent vapor through a top chamber opening 20 while the hydrous material and etching agent within reaction chamber 10 are drained to a drain through bottom chamber opening 18. This next step is performed such that wafers 12 are never exposed to the ambient atmosphere. In so doing, the solvent is preferably vaporized and heated to a temperature greater than about 50° centigrade. More preferably, the temperature is within the range of between about 50° and 200° centigrade. Even more preferably, the temperature is about 130° centigrade. The solvent can be any substance capable of solubilizing and dispersing photoresist material when heated and vaporized, though isopropyl alcohol is preferred. Other solvents, such as acetone, and other alcohols may also be used.

In one embodiment, the solvent is heated and vaporized in a boiler 22 adjacent to reaction chamber 10. The heated solvent vapor is pressure or vacuum flowed from boiler 22 into reaction chamber 10. In flowing the heated solvent vapor through reaction chamber 10, a thin layer of liquid solvent typically forms above the hydrous material and etching agent. This tends to help rinse the portions of film 26 etched by the etching agent from the surface of wafers 12.

As the hydrous material and etching agent are drained away, the exposure to the heated solvent vapors solubilizes the photoresist material. The solubilized photoresist material, by way of a draining means or process, is carried off of and away from the film upon which the photoresist material was situated. Preferably, the drainage of the solubilized photoresist material will be directed to one of the drains illustrated in FIGS. 1 and 2, either through bottom chamber opening 18 or through top chamber opening 20, to a facility drainage system by a means for draining the chamber. By way of example and illustration, a draining means can be a gravity feed. Additionally, the draining means can be by way of an application of a positive or a negative pressure to chamber 10 so as to drain the solubilized photoresist material off subadjacent film 26, and through bottom chamber opening 18, into a valve shown in FIG. 1, and out the drain illustrated therein.

If a particularly clean surface is required, subsequent chemical cleaning can optionally be conducted after the photoresist removal, and is preferably also conducted within reaction chamber 10. After the chemical cleaning is finished, wafers 10 are rinsed within reaction chamber 10 and dried using one of a number of known methods, including flowing further hot solvent over wafers 12. Preferably, each of these steps are also conducted within the same reaction chamber, thereby reducing the cost and time involved with transferring wafers 12 between chambers.

As the solvent to which the wafer is exposed is a heated vapor, minimal amounts of the heated vapor solvent are required. Also, vapor solvents are typically less expensive than chemical cleaning agents, so that relatively low process costs are incurred in providing the heated vapor solvent. Furthermore, vapor solvents are typically not caustic, and consequently disposal procedures for non-caustic vapor solvents are typically less costly than for chemical cleaning agents.

Thus, a method is disclosed whereby a layer of photoresist material on a film of an in-process integrated circuit wafer is removed using heated solvent vapor. Under the present method, the expensive and caustic chemical cleaning agents presently necessary in the art are not required. This enhances the safety of the process and reduces cost by eliminating the need for providing and disposing of these chemical cleaning agents. Furthermore, even greater expense and time are saved by being able to conduct both the photoresist material removal and the etch step within the same chamber.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for the removal of photoresist material from an in-process integrated circuit wafer, comprising:
   providing a film having a surface which is to be etched on the in-process integrated circuit wafer;
   providing a layer of photoresist material on the film;
   selectively etching the film with the use of the photoresist material; and
   exposing the photoresist material, not in a plasma, to a solvent vapor to solubilize the photoresist material, said solvent vapor being alcohol.

2. A method as recited in claim 1, wherein the solvent vapor comprises isopropyl alcohol.

3. A method as recited in claim 1, wherein the solvent vapor is heated to a temperature in the range of between about 50° C. and about 200° C.

4. A method as recited in claim 1, further comprising removing the solubilized photoresist material off of the film.

5. A method as recited in claim 1, wherein both selectively etching the film and exposing the photoresist material to the solvent vapor are conducted in a closed reaction chamber, and wherein an etching agent flows in one direction through the closed reaction chamber while selectively etching the film and the solvent vapor flows in a reverse direction while exposing the photoresist material to the solvent vapor.

6. A method as recited in claim 1, further comprising cleaning the in-process integrated circuit wafer subsequent to exposing the photoresist material to the solvent vapor.

7. A method as recited in claim 6, wherein exposing the photoresist material to the solvent vapor and cleaning the in-process integrated circuit wafer are both conducted within a closed reaction chamber with no intervening exposure to an ambient atmosphere.

8. A method as recited in claim 1, further comprising rinsing the in-process integrated circuit wafer subsequent to exposing the photoresist material to the solvent vapor.

9. A method as recited in claim 8, further comprising drying the in-process integrated circuit wafer with an isopropyl alcohol vapor subsequent to exposing the photoresist material to the solvent vapor.

10. A method as recited in claim 9, wherein exposing the photoresist material to the solvent vapor, rinsing the in-process integrated circuit wafer, and drying the in-process integrated circuit wafer are all conducted within a closed reaction chamber without intervening exposure to an ambient atmosphere.

11. A method as recited in claim 1, wherein exposing the photoresist material to the heated solvent vapor is conducted in a closed reaction chamber, and wherein at least one additional method step is also conducted within the closed reaction chamber without intervening exposure to an ambient atmosphere.

12. A method as recited in claim 1, wherein selectively etching the film comprises a wet acid etch.

13. A method as recited in claim 12, wherein the in-process integrated circuit wafer is not exposed to the ambient atmosphere between the wet acid etch and exposing the photoresist material to the solvent vapor.

14. A method as recited in claim 1, wherein exposing the photoresist material to the heated solvent vapor is conducted in a closed reaction chamber, and wherein the closed reaction chamber comprises a cluster tool.

15. A method for the removal of photoresist material from an in-process integrated circuit wafer comprising:

provideing a film having a surface which is to be etched on the in-process integrated circuit wafer;

providing a layer of photoresist material on the film;

selectively etching the film with the use of the photoresist material; and exposing the photoresist material, not in a plasma, to a solvent vapor within a closed reaction chamber to solubilize the photoresist material, said solvent vapor being an alcohol.

16. A method as recited in claim 15, wherein the solvent vapor comprises isopropyl alcohol.

17. A method as recited in claim 15, wherein the solvent vapor is heated to a temperature in the range of between about 50° C. and about 200° C.

18. A method as recited in claim 17, wherein both selectively etching the film and exposing the photoresist material to the solvent vapor are conducted in the closed reaction chamber, and wherein an etching agent flows in one direction through the closed reaction chamber while selectively etching the film and the solvent vapor flows in a reverse direction while exposing the photoresist material to the solvent vapor.

19. A method as recited in claim 17, further comprising cleaning the in-process integrated circuit wafer subsequent to exposing the photoresist material to the solvent vapor.

20. A method as recited in claim 19, wherein exposing the photoresist material to the solvent vapor and cleaning the in-process integrated circuit wafer are both conducted within the closed reaction chamber.

21. A method as recited in claim 17, further comprising rinsing the in-process integrated circuit wafer subsequent to exposing the photoresist material to the solvent vapor.

22. A method as recited in claim 21, further comprising drying the in-process integrated circuit wafer with an isopropyl alcohol vapor subsequent to exposing the photoresist material to the solvent vapor.

23. A method as recited in claim 22, wherein exposing the photoresist material to the solvent vapor, rinsing the in-process integrated circuit wafer, and drying the in-process integrated circuit wafer are all conducted within the closed reaction chamber without intervening exposure to an ambient atmosphere.

24. A method as recited in claim 17, wherein the closed reaction chamber comprises a cluster tool.

25. A method as recited in claim 17, wherein at least one additional method step is also conducted within the closed reaction chamber without intervening exposure to the ambient atmosphere.

26. A method as recited in claim 17, wherein selectively etching the film comprises a wet acid etch.

27. A method as recited in claim 26, wherein selectively etching the film is conducted in the closed reaction chamber, and wherein the in-process integrated circuit wafer is not exposed to an ambient atmosphere between selectively etching the film and exposing the photoresist material to the solvent vapor.

28. A method for the removal of photoresist material from an in-process integrated circuit wafer comprising:

providing a film having a surface which is to be etched on the in-process integrated circuit wafer;

providing a patterned layer of photoresist material on the film;

selectively etching the surface of the film to be etched through the patterned photoresist material in a wet acid etch in a closed reaction chamber;

exposing the photoresist material, not in a plasma, to isopropyl alcohol vapor heated to a temperature in the range of between about 50° C. and about 200° C. within the closed reaction chamber to solubilize the photoresist material; and removing the solubilized photoresist material away from the film surface and out of the closed reaction chamber.

29. A method for removing photoresist material comprising:

providing a layer of a photoresist material upon a surface;

forming a layer of a solvent, in a non-plasma environment, upon the photoresist material from a vapor thereof; and dissolving the photoresist material into the layer of the solvent, said solvent vapor being an alcohol.

30. A method as recited in claim 29, further comprising draining from a chamber the layer of the solvent into which the photoresist material is dissolved.

31. A method as recited in claim 29, wherein dissolving the photoresist material into the layer of the solvent is conducted in a closed reaction chamber.

32. A method as recited in claim 29, wherein solvent vapor comprises isopropyl alcohol.

33. A method as recited in claim 29, wherein the solvent vapor is heated to a temperature in the range of between about 50° C. and about 200° C.

34. A method as recited in claim 29, wherein the surface upon which the layer of a photoresist material is provided is the surface of a film, the method further comprising:

selectively removing the film prior to dissolving the photoresist material into the layer of the solvent.

35. A method as recited in claim 34, wherein the layer of the photoresist material is patterned, and wherein selectively removing the film comprises a wet acid etch of the film through the patterned layer of the photoresist material.

* * * * *

UNITED STATES PATENT AND TRADEMARK OFFICE
CERTIFICATE OF CORRECTION

PATENT NO. : 5,785,875
DATED : Jul. 28, 1998
INVENTOR(S) : Richard C. Hawthorne; Jonathan C. Morgan; Li Li It is certified that error appears in the above-identified patent and that said Letters Patent is hereby corrected as shown below:

Col. 2, line 19, after "fewer" change "methods" to --method--

Col. 4, line 22, after "to be" change "etche:" to --edtched.--

Col. 5, line 6, after "typically" change "requires" to --require--

Col. 5, line 59, after "wafers" change "10" to --12--

Signed and Sealed this

Thirteenth Day of July, 1999

Attest:

Q. TODD DICKINSON

*Attesting Officer*     Acting Commissioner of Patents and Trademarks